United States Patent
Jacobson et al.

(10) Patent No.: US 9,557,033 B2
(45) Date of Patent: Jan. 31, 2017

(54) OPTICAL SYSTEM FOR BATWING DISTRIBUTION

(75) Inventors: Benjamin A. Jacobson, Chicago, IL (US); Robert D. Gengelbach, Rochester, NY (US); Nicholas W. Medendorp, Jr., Raleigh, NC (US); Lawrence Roberts, Cary, NC (US); John Perry, Raleigh, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 12/074,762

(22) Filed: Mar. 5, 2008

(65) Prior Publication Data

US 2009/0225543 A1 Sep. 10, 2009

(51) Int. Cl.
*F21V 3/00* (2015.01)
*F21V 5/00* (2015.01)
(Continued)

(52) U.S. Cl.
CPC ............... *F21V 13/04* (2013.01); *F21S 4/28* (2016.01); *F21V 5/007* (2013.01); *F21V 5/04* (2013.01);
(Continued)

(58) Field of Classification Search
CPC .......... F21V 5/007; F21V 5/04; F21V 7/0025; F21V 7/005; F21V 7/0066; F21V 7/043; F21V 7/09; F21V 7/20; F21S 4/008; G02B 27/095; G02B 27/0955; F21Y 2103/003; H01L 33/54
(Continued)

(56) References Cited

U.S. PATENT DOCUMENTS 1,794,839 A 3/1931 Dorey
2,486,558 A 11/1949 Franck
(Continued)

FOREIGN PATENT DOCUMENTS

CN 1586017 A 2/2005
EP 1 255 132 A1 11/2002
(Continued)

OTHER PUBLICATIONS

PCT Notification of Transmittal of International Preliminary Report on Patentability. Sep. 26, 2007.
(Continued)

*Primary Examiner* — Jason Moon Han
(74) *Attorney, Agent, or Firm* — Koppel, Patrick, Heybl & Philpott

(57) ABSTRACT

A radiation distribution system designed to produce a batwing distribution. The system may be used with radiative sources emitting in the visible spectrum or in other spectra. The system comprises a specially shaped lens disposed over a radiative source, such as an LED, for example. The lens and source are arranged between two reflector bodies, both of which have an elongated reflective surface that faces the source. The reflector bodies each have two different reflective surfaces that face outward and away from each other. The lens and both reflective surfaces work in concert to redirect a portion of the emitted radiation to create the desired batwing distribution. Several sources may be arranged linearly between a single pair of reflector bodies on a common surface to create a linear array of sources. Likewise, multiple linear arrays may be combined to form a two-dimensional array. In the two-dimensional configuration, linear arrays of sources are disposed on both sides of a reflector body, so that both of the reflective surfaces are utilized.

16 Claims, 11 Drawing Sheets

(51) Int. Cl.

| | | |
|---|---|---|
| *F21V 13/04* | (2006.01) | |
| *F21V 5/04* | (2006.01) | |
| *G02B 27/09* | (2006.01) | |
| *F21V 29/71* | (2015.01) | |
| *F21V 29/76* | (2015.01) | |
| *F21V 29/00* | (2015.01) | |
| *F21W 131/103* | (2006.01) | |
| *H01L 33/54* | (2010.01) | |
| *F21V 29/505* | (2015.01) | |
| *F21Y 101/00* | (2016.01) | |

(52) U.S. Cl.
CPC ............. *F21V 29/71* (2015.01); *F21V 29/763* (2015.01); *G02B 27/095* (2013.01); *F21V 29/004* (2013.01); *F21V 29/505* (2015.01); *F21W 2131/103* (2013.01); *F21Y 2101/00* (2013.01); *F21Y 2103/10* (2016.08); *F21Y 2105/10* (2016.08); *F21Y 2115/10* (2016.08); *H01L 33/54* (2013.01)

(58) Field of Classification Search
USPC ............... 362/249.02, 311.02, 311.06–311.1, 326,362/545, 800
See application file for complete search history.

(56) References Cited

U.S. PATENT DOCUMENTS

| | | | |
|---|---|---|---|
| 2,647,202 A | 7/1953 | Elmer | |
| 2,921,181 A | 1/1960 | Elmer | |
| 3,210,536 A | 10/1965 | Elmer | |
| 3,398,272 A | 8/1968 | Elmer | |
| 3,711,722 A | 1/1973 | Kavanagh | 250/216 |
| 3,774,021 A | 11/1973 | Johnson | 362/27 |
| 4,638,343 A | 1/1987 | Althaus et al. | 357/17 |
| 4,918,497 A | 4/1990 | Edmond | 357/17 |
| 4,941,072 A | 7/1990 | Yasumoto et al. | 362/249 |
| 5,013,144 A | 5/1991 | Silverglate et al. | 350/435 |
| 5,027,168 A | 6/1991 | Edmond | 357/17 |
| 5,676,453 A | 10/1997 | Parkyn, Jr. et al. | 362/260 |
| 5,699,201 A | 12/1997 | Lee | 359/708 |
| 5,897,201 A | 4/1999 | Simon | |
| 5,924,788 A | 7/1999 | Parkyn, Jr. | 362/329 |
| 6,166,860 A | 12/2000 | Medvedev et al. | 359/641 |
| 6,231,220 B1 | 5/2001 | Shibuya et al. | 362/507 |
| 6,273,596 B1 | 8/2001 | Parkyn, Jr. | 362/522 |
| 6,361,190 B1 | 3/2002 | McDermott | 362/310 |
| 6,598,998 B2 | 7/2003 | West et al. | 362/307 |
| 6,603,243 B2 | 8/2003 | Parkyn et al. | 313/113 |
| 6,607,286 B2 | 8/2003 | West et al. | 362/255 |
| 6,639,733 B2 | 10/2003 | Minano et al. | 359/728 |
| 6,641,284 B2 | 11/2003 | Stopa et al. | 362/240 |
| 6,646,813 B2 | 11/2003 | Falicoff et al. | 359/641 |
| 6,674,096 B2 | 1/2004 | Sommers | 257/98 |
| 6,679,621 B2 | 1/2004 | West et al. | 362/327 |
| 6,972,439 B1 | 12/2005 | Kim et al. | 257/98 |
| 6,995,402 B2 | 2/2006 | Ludowise et al. | 257/91 |
| 7,006,306 B2 | 2/2006 | Falicoff et al. | 359/800 |
| 7,009,213 B2 | 3/2006 | Camras et al. | 257/98 |
| 7,021,797 B2 | 4/2006 | Minano et al. | 362/355 |
| 7,042,655 B2 | 5/2006 | Sun et al. | 359/708 |
| 7,111,964 B2* | 9/2006 | Suehiro et al. | 362/328 |
| 7,118,236 B2* | 10/2006 | Hahm | H01L 33/58 257/98 |
| 7,118,262 B2 | 10/2006 | Negley | 362/555 |
| 7,202,507 B2 | 4/2007 | Isokawa | 257/95 |
| 7,339,200 B2* | 3/2008 | Amano | F21S 48/1145 257/98 |
| 7,455,423 B2 | 11/2008 | Takejaka | 362/231 |
| 7,674,018 B2* | 3/2010 | Holder | F21K 9/00 362/311.02 |
| 7,677,760 B2 | 3/2010 | Simon | 362/235 |
| 2002/0057056 A1 | 5/2002 | Okazaki | |
| 2003/0156416 A1 | 8/2003 | Stopa et al. | |
| 2005/0094393 A1 | 5/2005 | Czajkowski | |
| 2005/0129358 A1 | 6/2005 | Minano et al. | |
| 2005/0225988 A1 | 10/2005 | Chaves et al. | |
| 2005/0263785 A1 | 12/2005 | Kim et al. | 257/100 |
| 2005/0276066 A1* | 12/2005 | Kim et al. | 362/561 |
| 2006/0018010 A1 | 1/2006 | Blumel | |
| 2006/0119250 A1* | 6/2006 | Suehiro et al. | 313/498 |
| 2006/0164833 A1 | 7/2006 | Parkyn et al. | |
| 2006/0198144 A1 | 9/2006 | Miyairi et al. | |
| 2007/0029563 A1 | 2/2007 | Amano et al. | |
| 2007/0121343 A1 | 5/2007 | Brown | |
| 2007/0247856 A1 | 10/2007 | Wang et al. | |

FOREIGN PATENT DOCUMENTS

| | | |
|---|---|---|
| EP | 1255132 A1 | 11/2002 |
| JP | 05-183194 | 7/1993 |
| JP | 05183194 | 7/1993 |
| JP | 5183194 | 7/1993 |
| JP | 0907927 | 4/1997 |
| JP | 997927 | 4/1997 |
| JP | 2000299500 | 10/2000 |
| JP | 2000299500 A | 10/2000 |
| JP | 2003008081 | 1/2003 |
| JP | 2004-140327 A | 5/2004 |
| JP | 2004-281606 A | 10/2004 |
| JP | 2004140327 | 5/2013 |
| WO | WO2008000244 A2 | 1/2008 |
| WO | WO2008077338 A1 | 7/2008 |
| WO | WO2008140884 A1 | 11/2008 |

OTHER PUBLICATIONS

PCT Internationl Search Report and Written Opinion Feb. 2, 2006.
Physics of Seminconductor Devices, $2^{nd}$ Edition, S.M. Sze, Tunnel Devices, Chapter 9, pp. 513-536. 1981. A Wiley-Interscience Publication.
Patent Abstracts of Japan, vol. 017, No. 599, Nov. 2, 1993 Koichi.
Patent Abstracts of Japan, vol. 2000, No. 13, Feb. 5, 2001, Mayumi.
Patent Abstracts of Japan, vol. 1997, No. 08, Aug. 29, 1997, Toshiba Corp.
Dec. 27, 2005. Applicant Response to Pre-Exam Formalities Notice. U.S. Appl. No. 11/247,563.
Nov. 1, 2006. USPTO Office Communication. Non-Final Rejection. U.S. Appl. No. 11/247,563.
Apr. 2, 2007. Amendment after Non-Final Rejection. U.S. Appl. No. 11/247,563.
Jun. 26, 2007. USPTO Office Communication. Final-Rejection. U.S. Appl. No. 11/247,563.
Oct. 26, 2007. Amendment Submitted Entered with Filing of RCE. U.S. Appl. No. 11/247,563.
Jan. 11, 2008. USPTO Office Communication. Non-Final Rejection. U.S. Appl. No. 11/247,563.
May 9, 2008. Amendment after Non-Final Rejection. U.S. Appl. No. 11/247,563.
Office Action from related U.S. Appl. No. 11/247,563, Dated: Aug. 22, 2008.
PCT International Search Report and Written Opinion From Related PCT Application No. PCT/US2009//001212, Dated: Jul. 3, 2009.
Office Action for Taiwan Patent Application No. TW 094135548 dated Aug. 2, 2011.
Office Action from U.S. Appl. No. 11/247,563, filed Aug. 5, 2010.
Response to Office Action from U.S. Appl. No. 11/247,563, filed Jan. 3, 2011.
Notice of Reasons for Rejection from Japanese Patent Application No. 2007-536779 dated May 19, 2011.
Examiner's First Report for Australian Patent Application No. 2005295913 dated Jun. 30, 2010.
International Preliminary Report on Patentability dated Aug. 6, 2007 for PCT/US05/36438.
Office Action from counterpart European Patent Application No. 09 716 428.9 dated Feb. 24, 2011.

(56) References Cited

OTHER PUBLICATIONS

International Preliminary Report on Patentability for counterpart PCT Application No. PCT/US09/01212 mailed Mar. 7, 2011.
Second Examination Report for counterpart European Patent Application No. EP 09716428.9 dated Oct. 7, 2011.
European Search Report from European Patent Application No. 12164833.1-2423, dated Sep. 24, 2012.
Office Action from U.S. Appl. No. 11/247,563, dated: Mar. 16, 2011.
Response to Office Action from U.S. Appl. No. 11/247,563, filed May 16, 2011.
Advisory Action from U.S. Appl. No. 11/247,563, dated: Jun. 2, 2011.
Response to Office Action from U.S. Appl. No. 11/247,563, filed Aug. 16, 2011.
Second Office Action from Chinese Patent Appl. No. 200980115965.2, dated Jan. 21, 2013.
Office Action from Korean Patent Application No. 10-2007-7010841, dated: Dec. 19, 2011.
Examination Report from European Patent Application No. 09716428.9-2423, dated Sep. 7, 2012.
First Office Action from Chinese Application No. 200980115965.2, dated Apr. 6, 2012.
Third Office Action from Chinese Patent Appl. No. 200980115965.2, dated Sep. 14, 2013.
Extended European Search Report from European Appl. No. 14177165.9-1555, dated Sep. 30, 2014.
Fourth Office Action from Chinese Patent Appl. No. 200980115965.2, dated Apr. 21, 2014.
Office Action from U.S. Appl. No. 14/010,828, dated Apr. 1, 2014.
Office Action from U.S. Appl. No. 14/010,828, dated Sep. 9, 2014.
Office Action from U.S. Appl. No. 14/010,828, dated Feb. 19, 2015.
Patent Certificate from Chinese Patent No. ZL 2009801159652, dated Mar. 25, 2015.
Examination Report from European Patent Appl. No. 12 164 833.1-1756, dated Jun. 2, 2015.
Office Action from Korean Patent Appl. No. 10-2010-7022263, dated Jun. 4, 2015.
Office Action Summary from Korean Patent Appl. No. 10-2010-7022263, dated Jan. 27, 2016.

\* cited by examiner

FIG. 13a
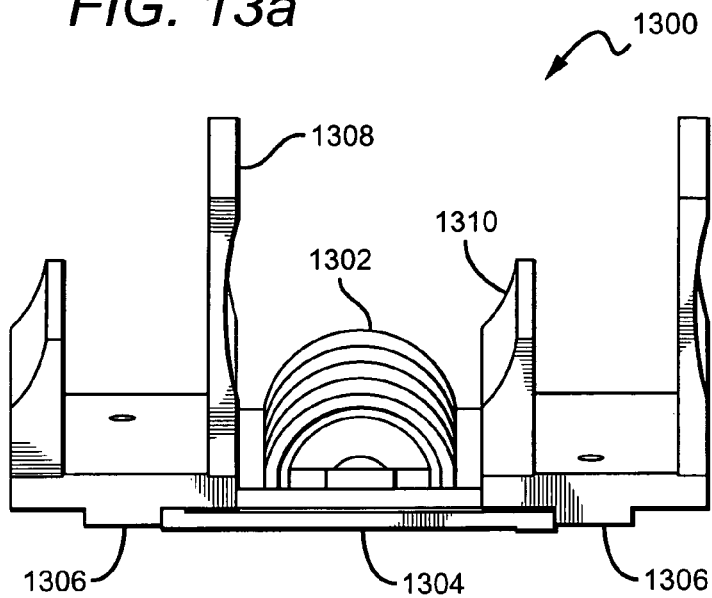
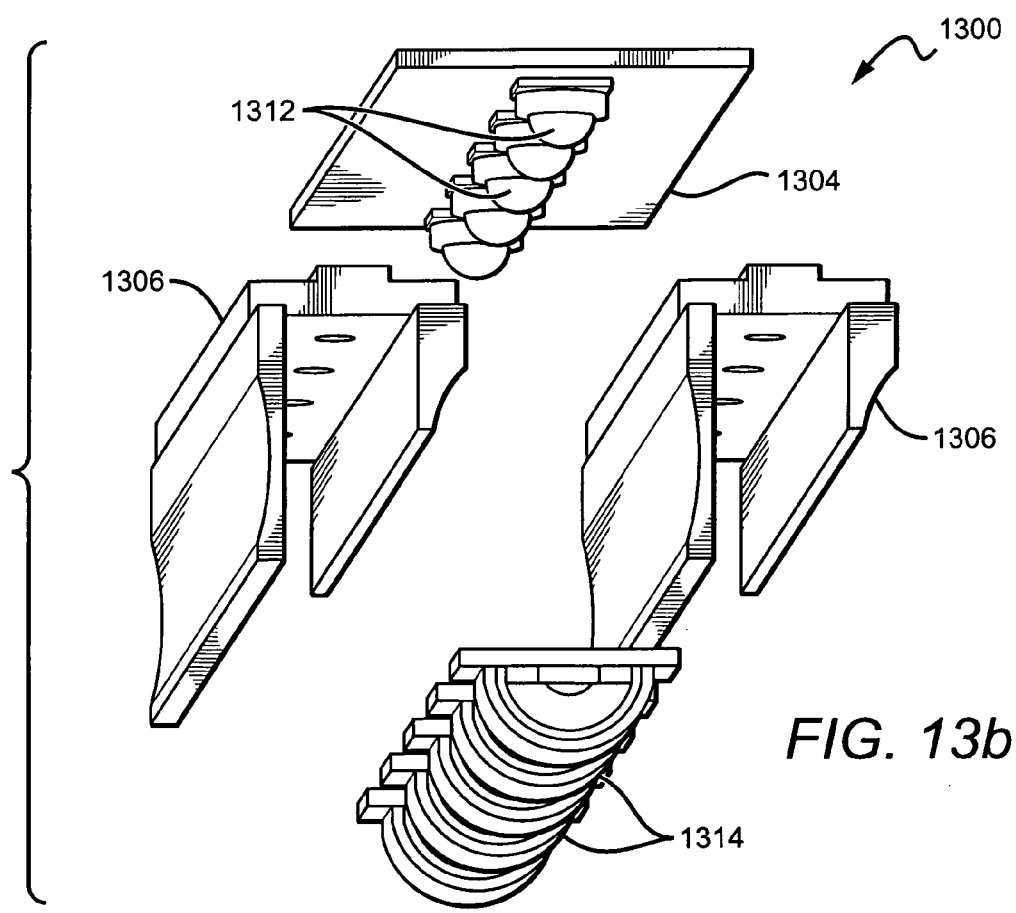
FIG. 13b

OPTICAL SYSTEM FOR BATWING DISTRIBUTION

BACKGROUND OF THE INVENTION

Field of the Invention

Embodiments of the present invention relate to radiation distribution systems, including optical systems that produce a batwing-type light distribution pattern.

Description of the Related Art

Many lighting applications require a fixture that produces a batwing-type distribution of light. The term "batwing" refers to a light distribution whose luminous intensity is greater along a direction at a significant angle relative to the main axis of distribution rather than along a direction parallel to the main axis. The desirability of a batwing distribution is evident in many lighting applications, including, for example, roadway lighting in which most of the light should be distributed in a direction parallel to the roadway.

FIG. 1a shows various types of roadway illumination patterns named with a convention used by the Illuminating Engineering Society (IES). As shown, there are five common types of roadway illumination. Type I illumination is a direct illumination in two directions along the direction of the roadway (if the road is a single road) and/or in a straight directional pattern at a cross section as shown by the Type I-4-Way pattern. Type V describes an omni-directional lighting pattern across the entire intersection. Type II is similar to Type I, but the light fixture is mounted above a point displaced away from the center of the region to be illuminated. Type III illumination shows a different angled illumination from normal as compared to Type II, where the angle of illumination from normal is narrower to reflect a smaller coverage area. Type IV illumination has an even narrower angle of illumination from normal to create a different, smaller illumination area than either Type III or Type II.

FIG. 1b shows a known generic light fixture 100 that is mounted at a height H above a surface 102 that is to be illuminated by the fixture 100. The main axis 104 starts at the fixture 100 and runs perpendicular to a plane containing surface 102. The light distribution on the surface is typically specified in terms of the illuminance I(x,y) measured in lumens/ft². The distribution of the light emanating from the fixture is typically specified in terms of the luminous intensity $P(\phi,\theta)$ measured in a direction making an angle $\phi$ relative to the main axis and lying in a plane that contains the main axis and is oriented at angle $\theta$, as shown in FIG. 1b. The illuminance and the luminous intensity are related by:

$$I(x, y) = \frac{P(\phi, \theta)}{H^2} \cos^3(\phi) \quad \text{(Eq. 1)}$$

$$x = H \tan\phi \cos\theta$$

$$y = H \tan\phi \sin\theta$$

where H is in feet.

In many applications, it is desirable to illuminate a region of a surface that is approximately rectangular or elliptical in shape. In FIG. 1b, the elliptical region 106 is substantially longer in one direction (along the x-axis) than in the other direction (along the y-axis). Outside the region 106 the illuminance falls off to a minimum level. In some applications (for example Types I, II, III, and IV from FIG. 1a), the region 106 may be substantially symmetrical about the main axis in the x-direction of the pattern and either symmetrical (Type I) or asymmetrical (Types II, III, IV) along the y-direction. The illuminance distribution can be approximately characterized by the illuminance vs. position functions along the axes, I(x,0) and I(0,y), and the luminous intensity along the two axes is:

$$P_x(\phi) = H^2 \frac{I(x, 0)}{\cos^3(\phi)} \quad \text{(Eq. 2)}$$

$$P_y(\phi) = H^2 \frac{I(0, y)}{\cos^3(\phi)}$$

where H is the height (in feet) of the source above a surface.

For applications where the maximum value of $\phi$ is 20-25° or less, the $1/\cos^3(\phi)$ factor is less than about 1.3, and many such lighting applications can use conventional collimators to achieve acceptable uniformity. For other applications, however, the illuminance is desired to be uniform out to values of $\phi$ of 30° or more. The $1/\cos^3(\phi)$ factor at these angles rises sharply with $\phi$, reaching values much greater than 1 well before the illuminance factor drops off. The characteristic batwing shape of $P(\phi)$ is critical in these applications in order to achieve substantial illuminance uniformity.

FIG. 2 shows a pair of graphs showing distributions for an exemplary roadway luminaire mounted at H=25 ft, calculated according to the given equations. FIG. 2 shows a uniform illuminance I(x,0) denoted as 204, extending ±50 ft in the x-direction of FIG. 1, and a uniform illuminance I(0,y) denoted as 208, extending −10 to +25 ft in the y-direction, with each illuminance falling off gradually outside those ranges. FIG. 2 also shows the corresponding intensity distributions 202 and 206, both batwing distributions. The batwing distribution 202 is along the long x-axis of the region 106 (e.g., along the roadway in the street lighting application), and the batwing distribution 206 is along the perpendicular y-axis.

Batwing luminaires are known in the prior art for use with incandescent and discharge lamps which are typically small sources emitting into a full spherical distribution. These sources are typically powerful enough such that one or two lamps can supply all the light needed for the entire fixture. Batwing optical systems for these sources typically use reflectors having asymmetric curvature, facets, or cut-off angles, as can be found in the prior art. Lenses are less common, but are also known, particularly Fresnel lenses or lenticular lenses. These prior art systems are adapted for incandescent and discharge lamps.

Recently, light-emitting diodes (LEDs) have become common in many lighting applications. The batwing optical systems used for incandescent and discharge lamps are not designed for use with LEDs. LEDs are typically arranged in arrays that have a large overall area. LEDs also emit only into the forward hemisphere, not into a full spherical pattern. It is desirable to have an improved batwing optical system adapted for light sources with these emission characteristics, and specifically for LEDs.

SUMMARY OF THE INVENTION

One embodiment of a radiation distribution system according to the present invention comprises the following elements. A lens is disposed on a mount surface. The lens has a dielectric surface comprising a middle section having a center region that is tapered in from both sides and two rounded end sections, an end section on each side of the center section. At least one elongated reflective surface is disposed external to the lens and proximate to the lens.

One embodiment of a light emitting diode (LED) array according to the present invention comprises the following elements. A plurality of LEDs is included, each of the LEDs at least partially covered by a lens. Each of a plurality of reflector bodies has two reflective surfaces running along a length of the reflector body. The reflective surfaces face outward, away from each other. The LEDs are arranged between any two of the reflector bodies such that a portion of the light emitted from the LEDs interacts with the reflective surfaces that face the LEDs.

One embodiment of a scalable light source according to the present invention comprises the following elements. A plurality of linear light source sub-arrays is arranged to form a two-dimensional array. A plurality of lenses is included with a respective one of the lenses arranged to interact with each of the light sources. A plurality of reflector bodies is included with a respective one of the reflector bodies disposed on each of the longer sides of each linear light source sub-array. The reflector bodies comprise two elongated reflective surfaces that face away from each other. The lenses and the reflective surfaces are designed to interact with light emitted from the light sources such that the illuminance has a batwing distribution.

One method for generating a light distribution pattern according the present invention comprises the following steps. A light source is provided. Light emitted from the light source is redirected a first time with a lens that substantially envelopes the light source. A portion of the light is redirected a second time with two reflective surfaces disposed one on each side of said light source. The emitted light is distributed in a batwing pattern.

BRIEF DESCRIPTION OF THE DRAWINGS

FIG. 13a is a perspective view of an embodiment of a radiation distribution system; FIG. 13b is an exploded view of same.

DETAILED DESCRIPTION OF THE INVENTION

Figure 1A:
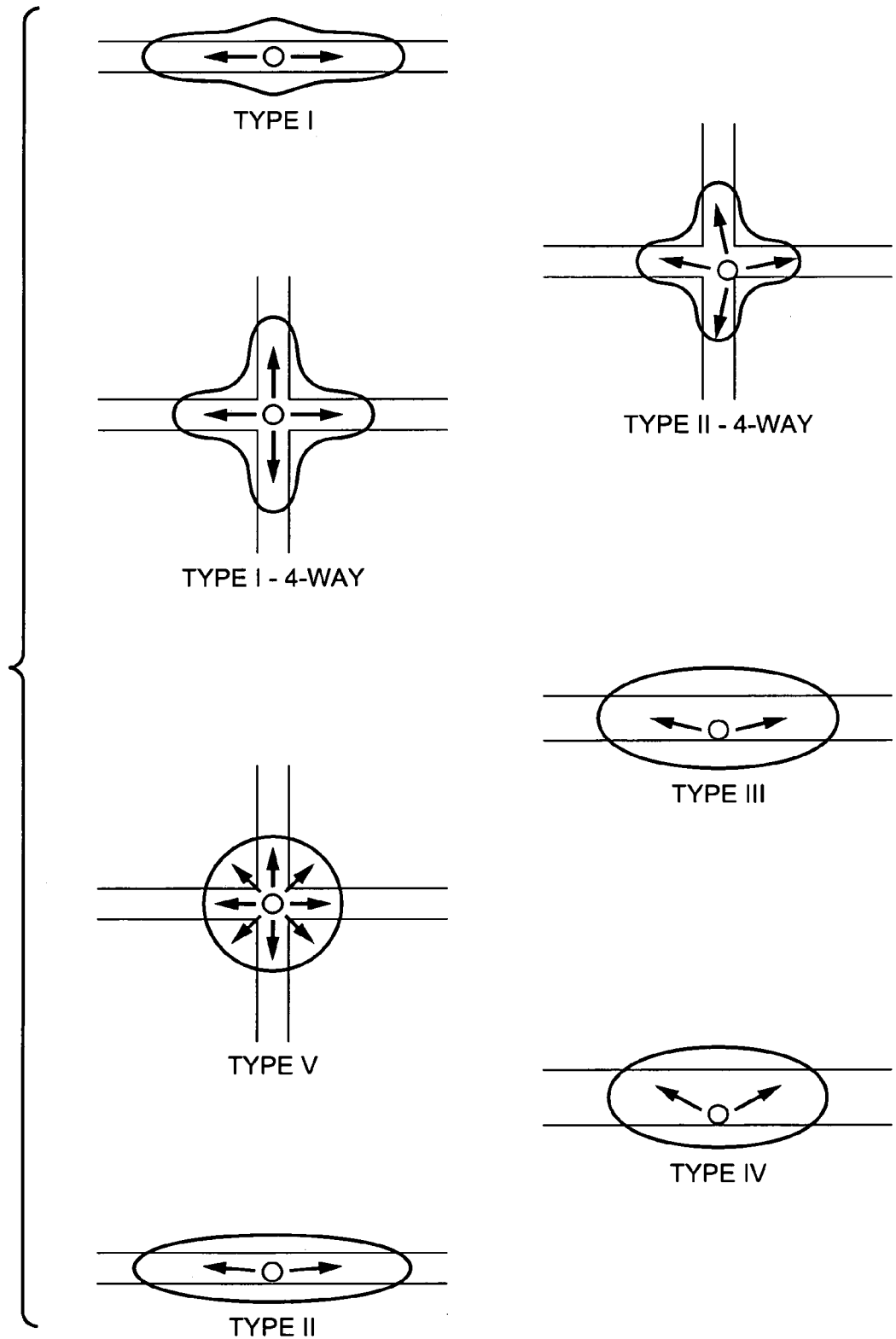
FIG. 1a is a series of diagrams showing some common roadway illumination patterns named with a convention used by the Illuminating Engineering Society (IES).
Figure 1B:
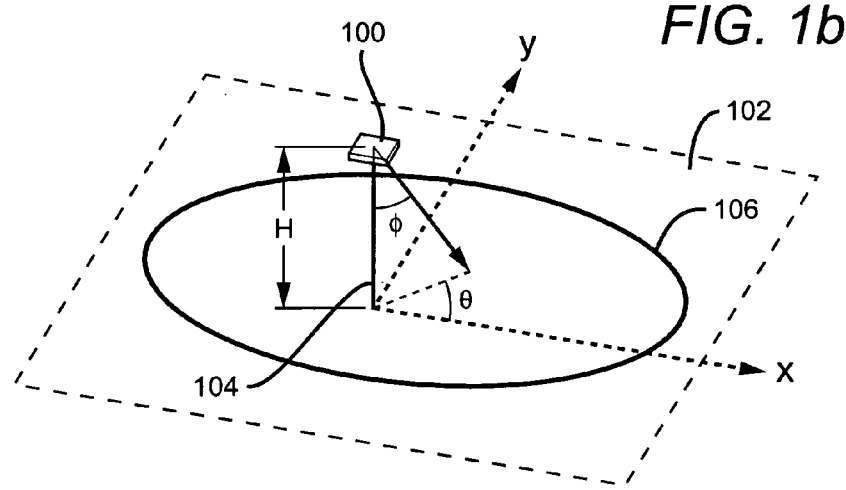
FIG. 1b is a perspective view of a generic light fixture known in the prior art, along with a generic coordinate system for describing a light distribution.
Figure 2:
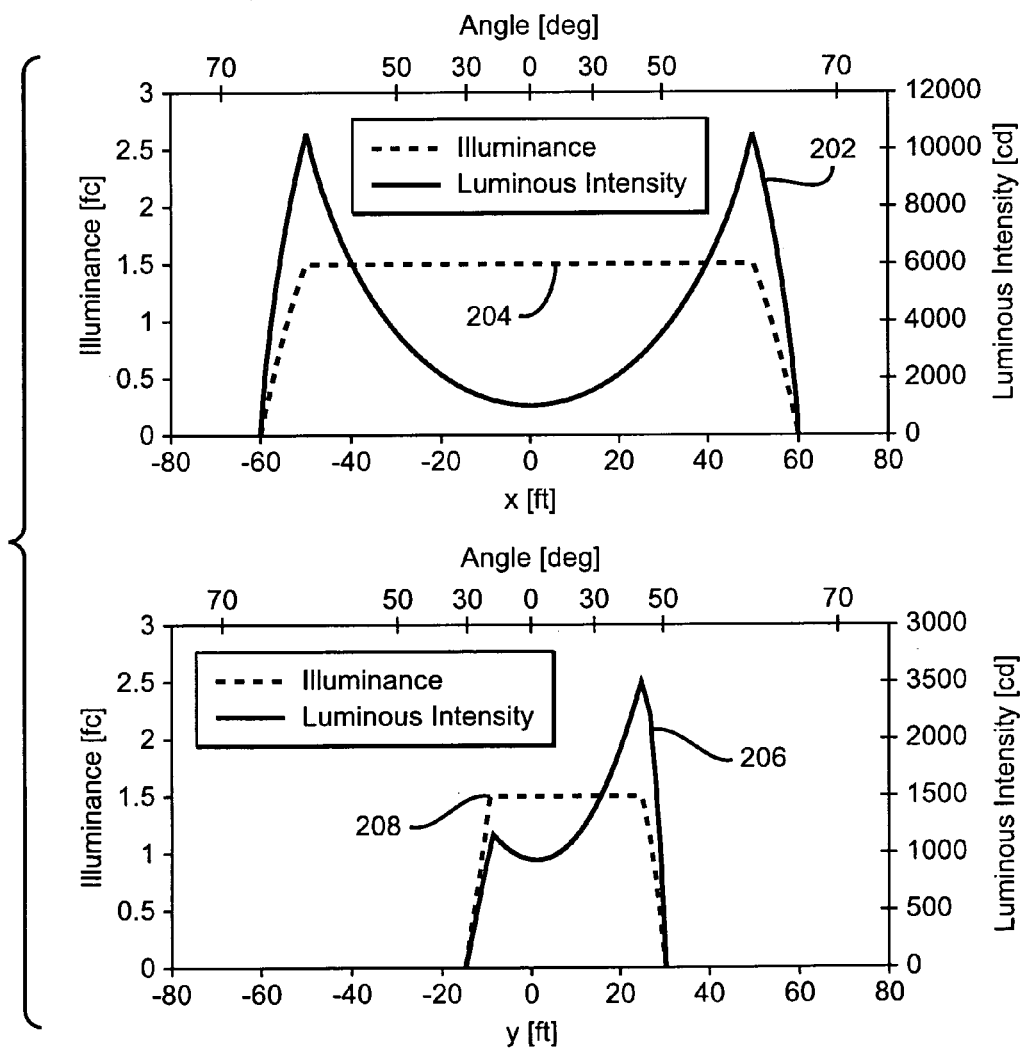
FIG. 2 shows two graphs of illuminance and luminous intensity as a function of distance in both axial directions relating to the light distribution of the known fixture in FIG. 1.

Embodiments of the present invention as claimed provide a radiation distribution system that generates a batwing distribution of luminous intensity. The system is particularly suited for use with LEDs and LED arrays. One or more light sources are positioned beneath a specially shaped lens that substantially envelopes the source(s). The shape of the lens is similar to a half peanut shell, sliced along the longer direction (i.e., the x-direction). At least one elongated reflective surface is positioned proximate to the lens and parallel to an axis running through center of the lens in the longer direction. In one embodiment two such elongated reflective surfaces are placed facing each other on opposite sides of the lens.

The light emitted from the source interacts with the enveloping lens first. The lens is made from an optically transmissive dielectric material. A dielectric interface formed by the boundary of the lens and the ambient material causes the light rays to be redirected, giving the light a first batwing distribution in the x-direction. The light exits the lens, a portion of which then interacts with the reflective surfaces. The reflective surfaces redirect the incident light, further shaping it into a second batwing distribution in a direction orthogonal to x-direction (i.e., the y-direction). The resulting two-dimensional batwing distribution has several applications, such as surface street lighting, low-bay lights, and architectural lighting fixtures, for example. In one embodiment, the batwing distribution can be tailored to a Type II roadway lighting pattern.

It is understood that when an element such as a layer, region or surface is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the invention, unless explicitly stated otherwise.

Figure 3A:
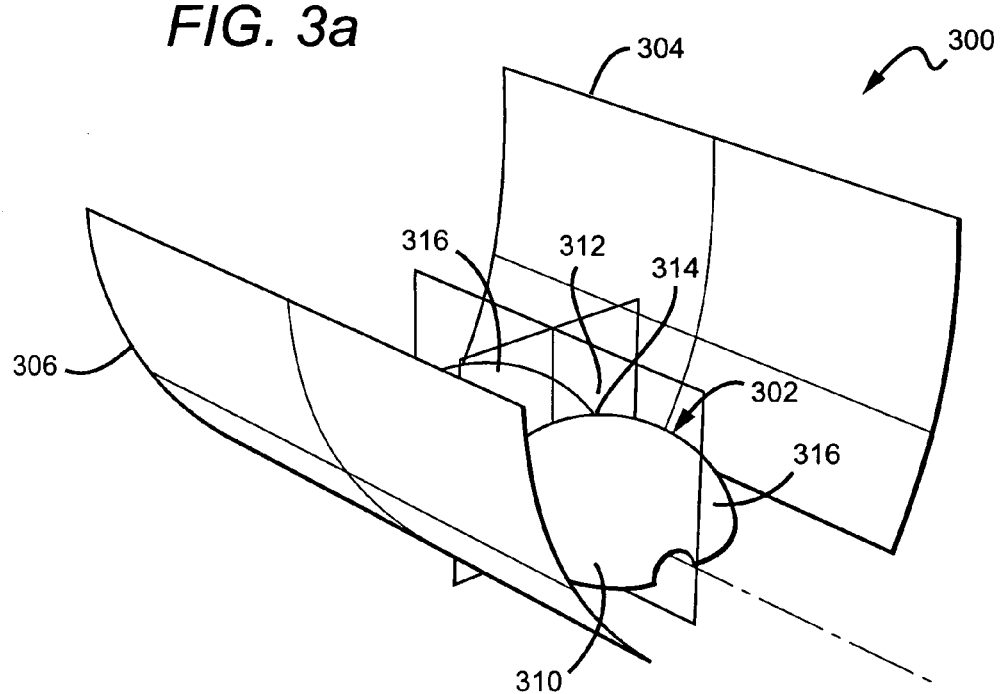
FIGS. 3a and 3b are three-dimensional perspective drawings of an embodiment of a radiation distribution system.
Figure 3B:
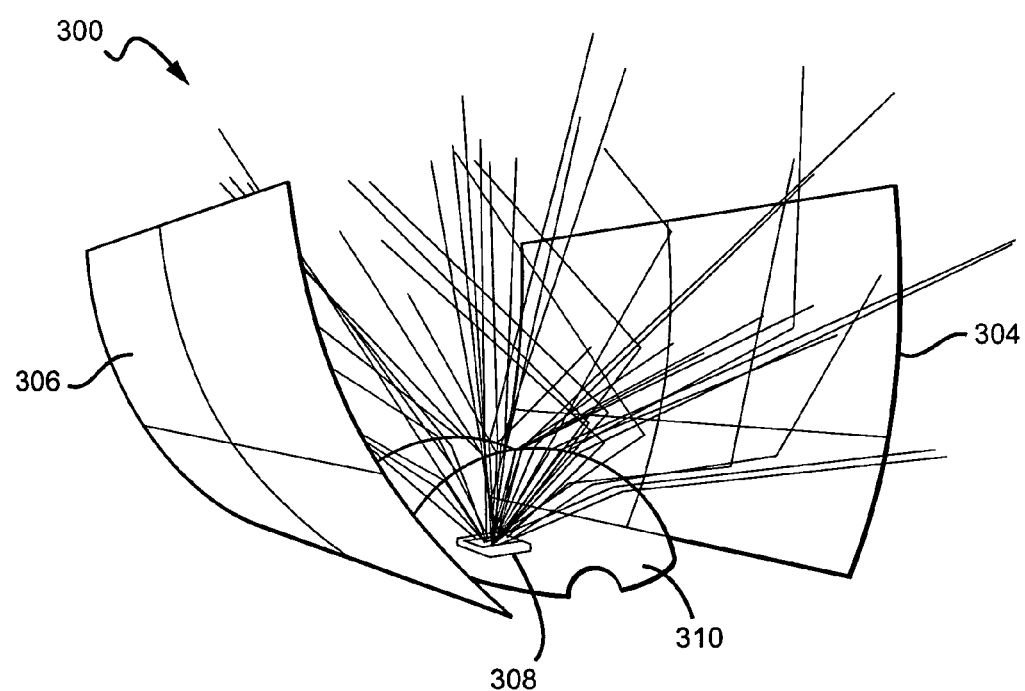

FIGS. 3a and 3b are three-dimensional perspective drawings, showing an embodiment of a radiation distribution system 300. FIG. 3b contains a ray trace that models the behavior of emitted light as it interacts with elements of the system. In FIG. 3a, the light rays are omitted so that the system may be viewed clearly. This particular embodiment comprises a lens 302 and two elongated reflective surfaces 304, 306 facing each other on opposite sides of the lens 302. A radiative source 308 (obscured from view in FIG. 3a) is disposed beneath the lens 302. Radiation emitted from the source 308 interacts with the lens 302 and the elongated surfaces 304, 306 to yield a batwing distribution.

The radiative source 308 is disposed on a surface (not shown in FIGS. 3a and 3b). The surface can be a printed circuit board (PCB), for example. A PCB allows the source 308 to be conveniently biased using an external power supply. In one embodiment, the radiative source 308 comprises an LED (or a plurality of LEDs) that emits radiation in the visible spectrum (approx. 350-850 nm). Other sources can be used, such as infrared emitters or ultraviolet emitters, for example. In some cases, it may be beneficial to use multiple radiative sources to increase output or achieve a particular output profile. For example, a red LED, a green LED and a blue LED might be used to create an RGB source, capable of outputting several different colors of light.

The radiative source 308 is almost completely enveloped by the lens 302. The lens 302 is made from a light transmissive dielectric material; the material may be transparent or translucent. Polymethyl methacrylate (PMMA or, commonly, acrylic) is an acceptable material, although many other materials can be used. The lens 302 has an exit surface 310 that may be shaped by known processes, such as casting or machining. In this particular embodiment, the exit surface 310 comprises a middle section 312 and two end sections 316 that have mirror-image symmetry. Indeed, the entire lens 302 has mirror-image symmetry as the lens 302 is symmetrical about both the longitudinal (x-z) axial plane and the transverse (y-z) axial plane. These two axial planes are shown in FIG. 3a. A longitudinal x-axis lies within in the longitudinal plane. The middle section 312 has a center region 314 that is tapered in from both sides, making it narrower than adjacent portions of the end sections 316. In this particular embodiment, the middle section 312 has a saddle-point on the surface 310 at the intersection of the longitudinal and transverse symmetry planes (i.e., at the center region 314). The end sections 316 are rounded as shown. Many different variations from the specific dimensions of the surface contours shown in FIGS. 3a and 3b may be used to tailor the batwing distribution pattern.

The exit surface 310 forms a dielectric interface with the material surrounding the lens (i.e., the ambient). The ambient material might be any material that surrounds the lens 302, such as air or water. The dimensions of the batwing distribution are determined, in part, by the index of refraction differential between the lens material and the ambient material. For larger differentials, the light will be refracted more dramatically when passing from the lens 302 into the ambient.

After the light exits lens 302, a portion of it continues unobstructed as emitted light. A portion of the light exiting the lens 302 at higher angles in the transverse directions (i.e. out the sides) interacts with the reflective surfaces 304, 306. Light that is incident on the reflective surfaces 304, 306 is redirected at an angle back toward the longitudinal axial plane as shown in FIG. 3b.

The reflective surfaces 304, 306 may be fabricated using any material that can be coated or formed to have a high specular reflectivity over the range of wavelengths that is emitted from the source 308. Some acceptable materials and fabrication techniques include extruded aluminum, machined aluminum, formed aluminum sheet metal, extruded polymers, molded polymers, cast aluminum, cast zinc and formed ceramic. To increase the reflectivity in the visible spectrum, the reflective surfaces 304, 306 may be polished and may also be coated for durability as well as reflectivity. Some typical coating processes include vacuum deposition of aluminum or silver, chemical or electroplating of aluminum or silver, and vacuum deposition of multilayer dielectric coatings. Typically, a reflective coating includes a protective overlayer, such as a transparent polymer, SiO, $SiO_2$ or an aluminum anodization layer. It may also be desirable to use a material having a high thermal conductivity. Such a material would help to dissipate generated heat away from the source 308, increasing its efficiency and lifetime.

Figure 4:
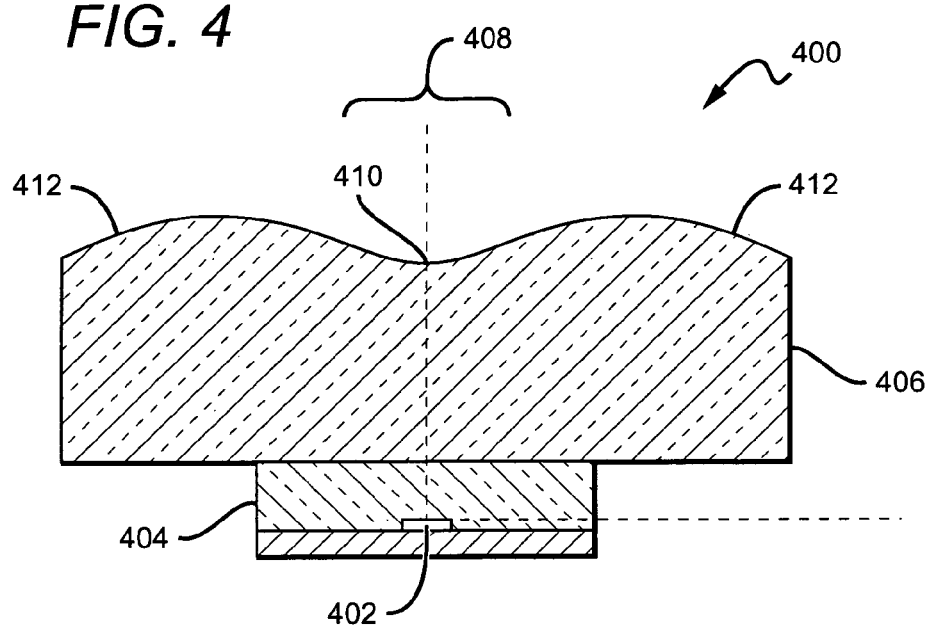
FIG. 4 is a cross-sectional view of an embodiment of a lens and a source.

FIG. 4 illustrates a cross-sectional view lying in the longitudinal symmetry plane of a radiation distribution system 400. The source 402 is enveloped by a dielectric encapsulant 404. If the source is an LED, an encapsulant may be used to enhance the quantity of the emitted light and to physically protect the source from moisture, mechanical contact, etc. In this embodiment, the encapsulant 404 is in contact with a lens 406 with no intervening air gap. The lens 406 can be fabricated by forming it directly on the encapsulant 404; for example, it may be molded or cast as a part of the encapsulant 404 using materials such as silicone or epoxy. Alternatively, the lens 406 can be formed separately using the same or a different material as the encapsulant 404 and then attached to the encapsulant 404 with an adhesive. In this particular embodiment, the lens 406 has a middle section 408 with a center region 410 at its narrowest point and two rounded end sections 412.

Figure 5:
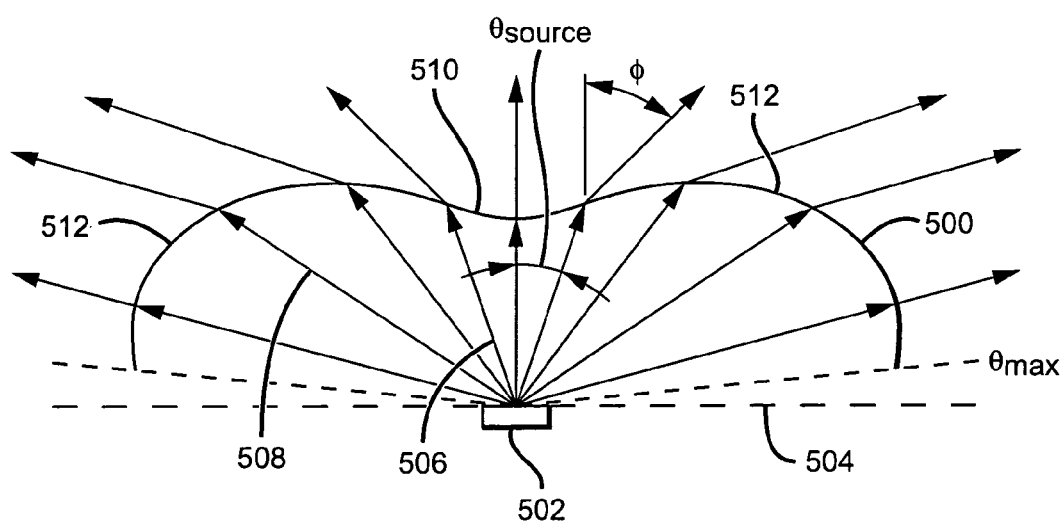
FIG. 5 is a cross-sectional view of an embodiment of a lens and a source.

FIG. 5 shows a cross-sectional view of an exemplary lens profile 500. In this embodiment the lens output surface is a surface of revolution formed by partially rotating the profile 500 about a rotational symmetry axis 504, parallel to the longitudinal axial plane. The lens profile is designed using the longitudinal luminous intensity function $P_x(\phi)$, which is in turn calculated from the illuminance function $I(x,0)$. For example, suppose the luminaire is to be mounted at 25 feet, and is meant to provide uniform illumination over x=±50 ft, with illuminance falling linearly to 0 over the next 10 feet. Then, $$I(x, 0) = \begin{cases} I_0 & |x| \le 50 \text{ ft} \\ I_0 \frac{|x| - 50 \text{ ft}}{10 \text{ ft}} & 50 \text{ ft} < |x| < 60 \text{ ft} \\ 0 & |x| \ge 60 \text{ ft} \end{cases} \quad \text{(Eq. 3)}$$

The luminous intensity $P_x(\phi)$ is then calculated according to Equation 2. In the central region (−50 ft to +50 ft):

$$P_x(\phi) = \frac{I_0}{(25 \text{ ft})^2} \frac{1}{\cos^3(\phi)} \quad \text{(Eq. 4)}$$

Note that $P_x(\phi)$ reaches a peak near the edge of the region of uniform illumination, at x=50 ft, corresponding to $\phi$=arctan (50/25)=63.4°. At this point the $1/\cos^3(\phi)$ factor is more than 10, i.e., the luminous intensity at 63.4° is more than 10 times higher than the luminous intensity at 0°.

The lens profile 500 can be calculated from $P_x(\phi)$ by assuming a source 502 located on or near the rotational symmetry axis 504. FIG. 5 shows the profile 500 and some exemplary light rays. The lens profile 500 maps the source power distribution $P_{source}(\theta_{source})$ into the output distribution $P_x(\phi)$ In general terms, rays emitted from the source with small values of $\theta_{source}$ (e.g., ray 506) are mapped into smaller values of $\phi$, and larger-angle source rays (e.g., ray 508) are mapped into larger values of $\phi$. In order to provide much higher luminous intensity at higher angles, the lens both reduces the intensity at low angles and increases the intensity at high angles. The concave central section 510 diverges the small-angle rays, and the convex outer sections 512 converge the larger-angle rays. The profile ends at a maximum source collection angle $\theta_{max}$.

The detailed profile can be calculated by various means. For example, the profile can be expressed as a polynomial in polar coordinates centered on the light source, and the terms in the polynomial can be optimized using Monte Carlo ray-tracing simulations. Alternatively, one can specify the desired output angle $\phi$ for each source ray angle $\theta_{source}$ in terms of an angle output function $\phi(\theta_{source})$. For a point source, there are various known methods for easily calculating the desired profile from such ray angle specifications. The profile can be calculated by any of these means, the resulting optical system performance can be simulated by Monte Carlo ray-tracing using a realistic extended source (not the simplified point source), and a new, compensated angle function $\phi(\theta_{source})$ can be generated to correct the non-uniformities observed in the simulation. For example, in calculating the exemplary profile 500 using Eq. 4, when the profile was first calculated using a point source, the resulting optical system output exhibited too much luminous intensity at $\phi$=0. This effect was compensated by recalculating the profile using a new specified illuminance function for the central region with a quadratic correction term that specifies a higher illuminance at larger angles:

$$I(x, 0) = \begin{cases} I'_0 \left[1 + a\frac{x^2}{(50 \text{ ft})^2}\right] & |x| \leq 50 \text{ ft} \\ I'_0(1+a)\frac{|x| - 50 \text{ ft}}{10 \text{ ft}} & 50 \text{ ft} < |x| < 60 \text{ ft} \\ 0 & |x| \geq 60 \text{ ft} \end{cases} \quad \text{(Eq. 5)}$$

It was found that acceptable performance could be obtained by empirically optimizing the coefficient a, with this coefficient generally in the range of 1.5 to 5. It will be appreciated that this compensation method could be applied using functional forms other than quadratic, for example, a higher degree polynomial whose coefficients would then constitute multiple adjustable compensation parameters. The method can also compensate for a variety of effects, for example, Fresnel reflections. The optimal ranges of a, or of any other compensation parameters, will vary depending on the effects being compensated, the size of the region to be illuminated, and other factors.

Figure 6:
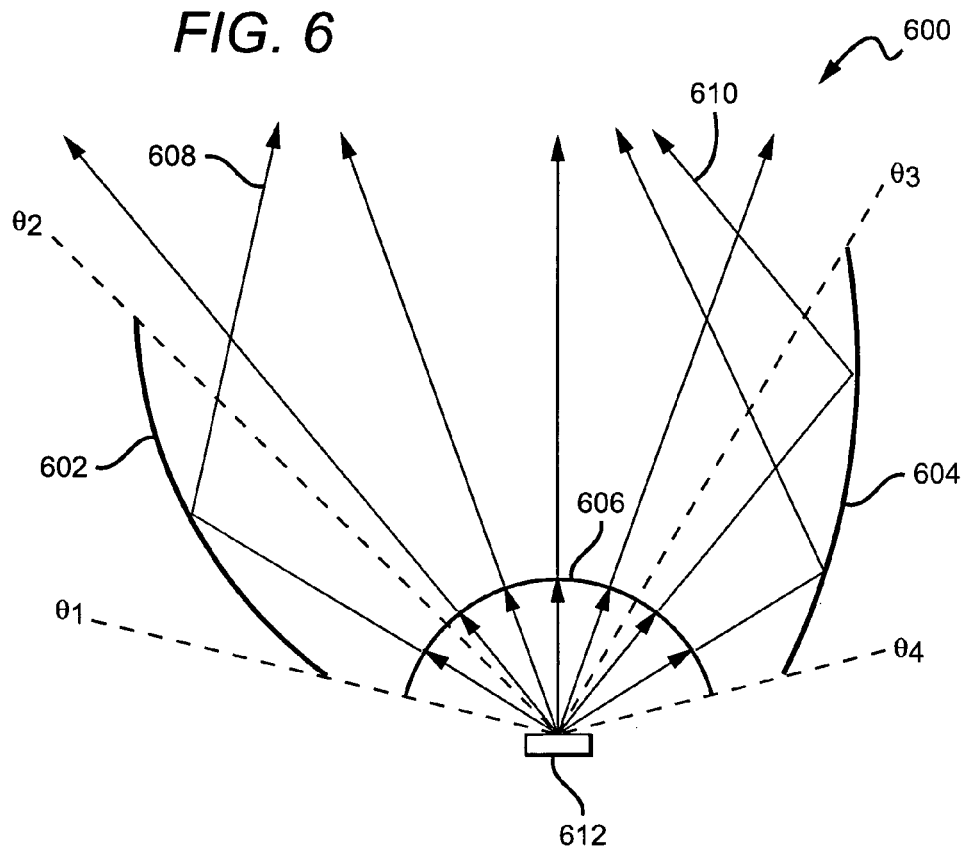
FIG. 6 is a cross-sectional view of an embodiment of a radiation distribution system.

FIG. 6 shows a cross-sectional view of a radiation distribution system 600. The system includes a lens 606 having an output surface that is a surface of rotation about a longitudinal axis passing through or at least near the light source 612. Reflector profiles 602, 604 are dependent on the desired transverse illuminance I(0,y). Similar to the lens calculation, the desired luminous intensity in the transverse axial plane inside the region to be illuminated is calculated by:

$$P_y(\phi) = \frac{I(0, y)}{H^2} \frac{1}{\cos^3\phi} \quad \text{(Eq. 6)}$$

However, the method of calculating the profiles is different. The cross-section of the system 600 is shown in the transverse symmetry plane of the lens 606, along with the projected angles in this plane of some sample rays. The reflector 602 intercepts any source rays with projected angles ranging from $\theta_1$ to $\theta_2$, and the reflector 604 intercepts source rays with projected angles ranging from $\theta_3$ to $\theta_4$. Note that the source rays exiting with projected angles $\theta_2$ to $\theta_3$ are uncontrolled by the reflectors. The design must compensate for the uncontrolled light. The lens output distribution $P_y$ is the sum of the uncontrolled fraction $P_{unc}$ (not incident on the reflectors) and a controlled fraction $P_{cont}$ (incident on the reflectors), given by:

$$P_y(\phi) = P_{unc}(\phi) + P_{cont}(\phi) \quad \text{(Eq. 7)}$$

Because the lens surface is rotationally symmetric about the axis passing through the source, the ray angles from a hypothetical point source located at or near the real source 612, projected into the plane perpendicular to the axis, are unchanged during refraction. For an extended source like the light source 612 if the deviation is small (i.e., as long as the source is substantially smaller than the radius of curvature of the lens surface around the axis), the source can still be approximated as a point source. In this case the output light projected distribution $P_{unc}$ not controlled by the reflectors is approximately the projected source distribution $P_{source}$ for angles $\phi$ between $\theta_2$ and $\theta_3$. This means the desired output of the reflectors can be approximated as:

$$P_{cont}(\phi) = \begin{cases} P_y(\phi) - P_{source}(\phi) & \phi \text{ in the range between } \theta_2 \text{ and } \theta_3 \\ P_y(\phi) & \phi \text{ outside the range between } \theta_2 \text{ and } \theta_3 \end{cases} \quad \text{(Eq. 8)}$$

The reflector profile 602 is then calculated to map the source projected angles $\theta_1$ to $\theta_2$ into specified portions of the output distribution $P_{cont}(\phi)$. Likewise, the profile 604 is calculated to map the source projected angles $\theta_3$ to $\theta_4$ into specified portions of the output distribution $P_{cont}(\phi)$. Specific methods of calculation resemble the methods described above for calculating the lens profile that maps source angles into the desired $P_x(\phi)$.

Certain characteristics of the light distribution I(0,y) and of the reflector profiles 602, 604 can be inferred from Eq. 8. First, since $P_{cont}(\phi)$ is a physically measurable power distribution it cannot be negative, so $P_y(\phi)$ must exceed $P_{source}(\phi)$ for all $\phi$ in the range between $\theta_2$ and $\theta_3$. In particular, if the illuminance is to be uniform, Eqs. 6 and 8 imply that $P_y(\phi)$ cannot be less than $P_{source}(\phi)$. Second, note that $P_y(\phi)$ increases with $\phi$, while $P_{source}(\phi)$ is usually peaked at $\phi=0$ and decreases at higher $\phi$, so the difference function $P_{cont}(\phi)$ must be an even stronger batwing distribution than $P_y(\phi)$. Moreover, the minimum value for the batwing distribution $P_y(\phi)$ is set by $P_{source}$. This can be summarized as:

$$P_{cont}(\phi) \geq \frac{P_{source}(0)}{\cos^3\phi} \qquad (\text{Eq. 9})$$

The reflectors typically redirect most of the light collected into the higher desired values of $\phi$. Third, the total power collected by the reflectors is limited to the power in the controlled angle ranges $\theta_1$ to $\theta_2$ and $\theta_3$ to $\theta_4$. If the uncontrolled angle range $\theta_2$ to $\theta_3$ is too large, then there is too little power left for the reflectors to collect to satisfy Eq. 9. This limits the angle ranges and the level of uniformity that can be achieved. For this reason, best uniformity can be achieved only when the illuminated region is limited to $\phi\approx\pm45°$ in the short axis (i.e., $y=\pm H$) when the region is symmetrically located with respect to the source. When the region is asymmetrically located, the total edge-to-edge range of $\phi$ in the short axis is still preferably less than 90°, and the largest angle $\phi$ in the short axis is preferably less than about 60° (i.e., $|y|<H \tan[60°]$). These limits apply only to the short axis of the region; the long-axis pattern is controlled by the lens, and is not limited in the same way.

Each reflector can be designed to illuminate only a section of the output distribution. In FIG. 6 the reflector 602 illuminates primarily the right-hand output angles as shown by ray 608, and the reflector 604 illuminates primarily the left-hand output angles as shown by ray 610. However, the reflector 602 could also be designed to illuminate the left-hand output angles, in which case the reflector 604 would illuminate the right-hand output angles. Alternatively, depending on the specific angular distribution desired, each reflector surface could be designed to illuminate both left-hand and right-hand output angles. Each of these options would require different reflector profiles.

Figure 7:
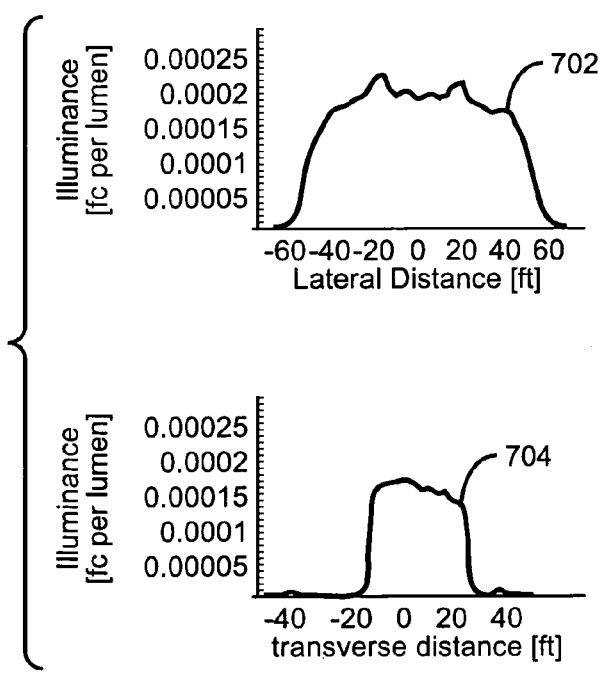
FIG. 7 shows two graphs of illuminance as a function of both axial distances relating to an embodiment of a radiation distribution system.

FIG. 7 shows the results of Monte Carlo raytrace simulations using two exemplary profiles as calculated above, with a simulated Cree 7090 XR-E LED light source. The figure shows two cross-sections of the simulated illuminance in footcandles (fc) per total lumen emitted by the source, on a planar surface 25 feet from the system. The illuminance per lumen data set 702 is in the longitudinal symmetry plane, and the illuminance per lumen data set 704 is in the transverse symmetry plane.

Figure 8:
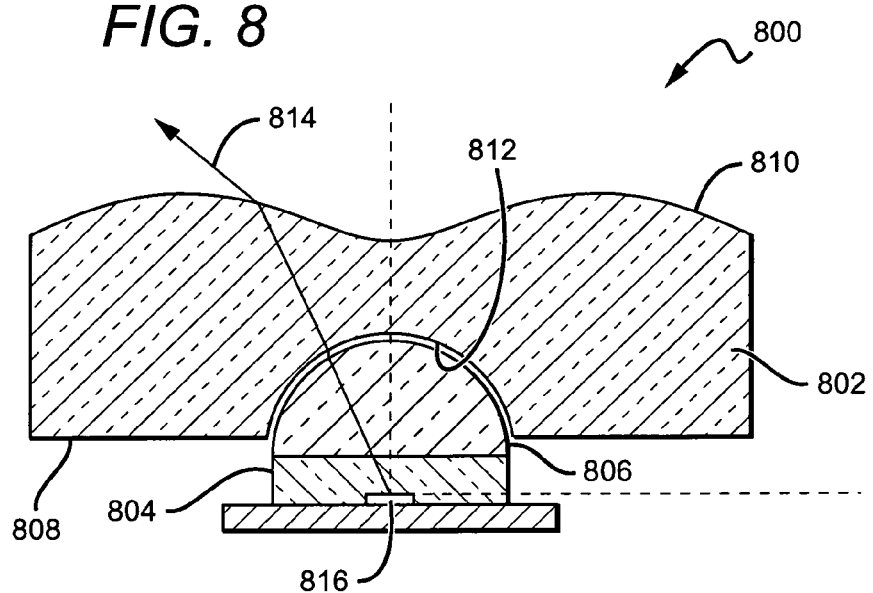
FIG. 8 is a cross-sectional view of an embodiment of a lens and a source.

Another embodiment of a radiation distribution system 800 is shown in FIG. 8. The figure shows a cross-section of a lens 802 in the longitudinal symmetry plane. The encapsulating medium 804 is in optical contact with a transparent dielectric light source dome 806. The lens 802 has a dielectric light entrance surface 808 opposite a light exit surface 810. In this particular embodiment, the light entrance surface 808 includes a dome cavity 812 that fits over the light source dome 806. An exemplary light ray 814 emitted by the light source 816 is refracted in turn by the light source dome 806, the lens light entrance surface 808, and the lens light exit surface 810. In determining the profile, all three refractions must be considered in order to ensure that the surfaces cooperate to produce the desired batwing distribution. In this embodiment, the lens 802 can be fabricated by common dielectric forming processes such as casting, injection molding, and compression molding, for example. Some acceptable materials include glass, acrylic, polycarbonate, polystyrene, and cyclic olefin copolymer.

Figure 9A:
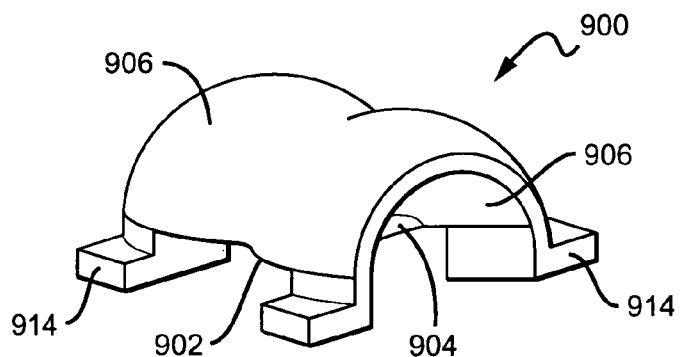
FIGS. 9a and 9b are perspective views of an embodiment of a lens.
Figure 9B:
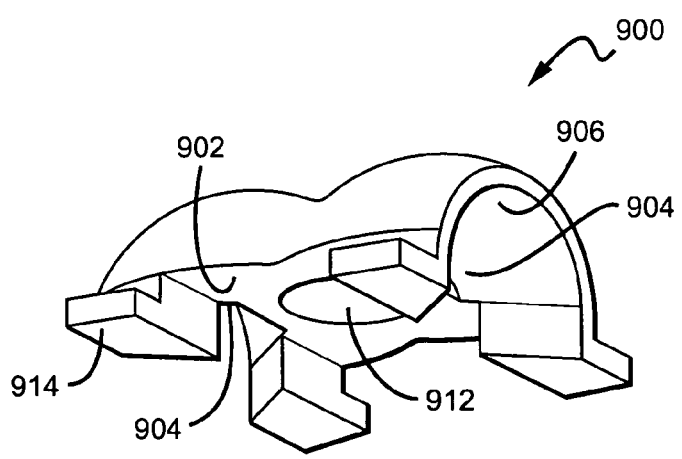
Figure 9C:
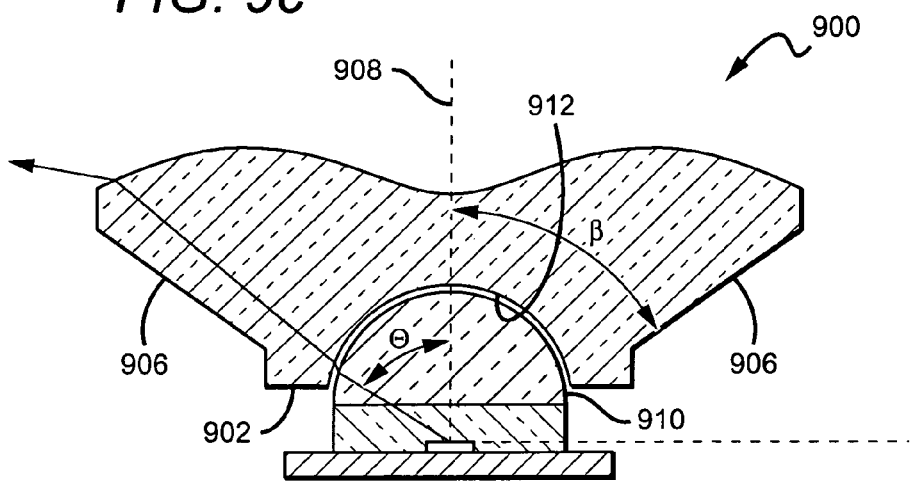
FIG. 9c is a cross-sectional view of same.

If the lens is fabricated using an injection molding process, it is desirable to minimize the thickness, and also to minimize variations in thickness in the different portions of the lens. Another advantage is the capability to add mounting features that are formed integrally with the lens. FIGS. 9a-c show three views of an embodiment of a lens 900 adapted for these purposes. FIGS. 9a and 9b show two perspective views; FIG. 9c shows a cross-sectional view in the longitudinal symmetry plane. The light entrance surface 902 has been modified to create hollow regions 904 that significantly reduce the lens thickness. These regions 904 are shaped to minimize the total amount of material and total thickness variation, while still avoiding significant loss of light transmitted by the lens 900. For example, a portion 906 of the light entrance surface is positioned at an angle $\beta$ to the central axis 908. If $\beta$ is too large, the lens thickness will not be appreciably reduced. If $\beta$ is too small, the portion 906 will intercept too much of the emitted light. For many light sources, the light is distributed substantially inside a cone defined by a limiting angle $\Theta$. In such a case, $\beta$ is preferably similar to or slightly larger than $\Theta$. For example, for the Cree XLamp 7090 LED, $\Theta$ is approximately 55-60°, and $\beta$ may be advantageously chosen between 50° and 70°.

Additionally, the cross-sectional view shows the lens 900 positioned over a dome-shaped encapsulant 910. Similar to the system shown in FIG. 8, the light entrance surface 902 of this embodiment includes a dome cavity 912 designed to cooperate with the light source dome 910.

The lens 900 also comprises positioning feet 914 that are integrally molded with the lens 900. As with the hollow regions 904, the feet 914 are preferably added to regions of the lens 900 that are positioned at angles greater than E relative to the axis 908, so that they intercept small amounts of the emitted light.

Figure 10A:
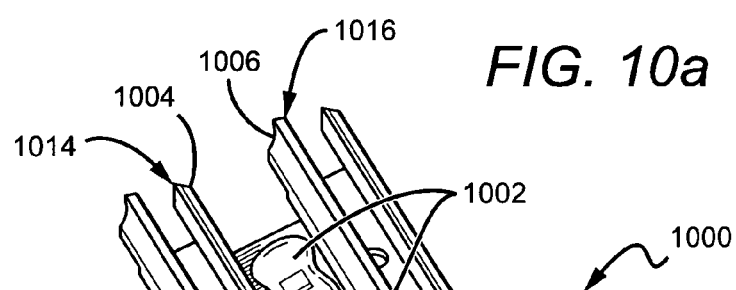
FIG. 10a is a perspective view of an embodiment of a radiation distribution system.
Figure 10B:
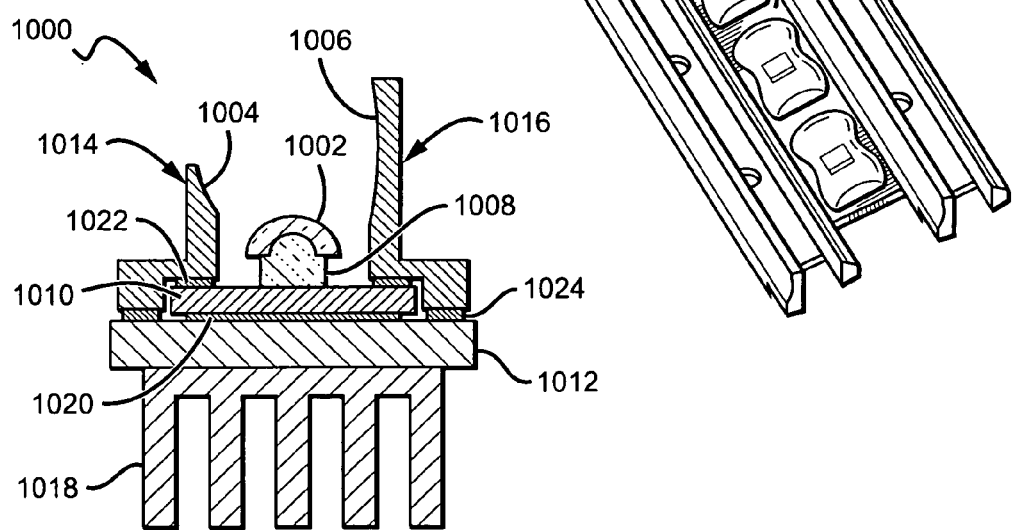
FIG. 10b is a cross-sectional view of same.

FIGS. 10a and 10b show two views of another embodiment of a radiation distribution system 1000. FIG. 10a is a perspective view, and FIG. 10b is a cross-sectional view in the transverse symmetry plane of the lens 1002. The reflective surfaces 1004 and 1006 are much longer in the longitudinal direction than a single lens 1002. Additional lenses 1002 and sources 1008 may be positioned linearly between a single pair of elongated reflective surfaces 1004, 1006. In this embodiment, multiple lenses 1002 can be molded as a single lens array, reducing molding cost and simplifying the assembly.

In some embodiments, operating performance and reliability of the source are enhanced if the system 1000 can effectively dissipate the heat produced by the source. In FIG. 10, for example, the sources 1008 may be LEDs. A linear array of five sources 1008 can be soldered onto a single metal-core circuit board 1010. The circuit board 1010 is then attached to a backplane 1012, possibly aluminum or another material having high thermal conductivity. The backplane 1012 also provides mounting surfaces for reflector bodies 1014, 1016, which comprise the reflective surfaces 1004, 1006, respectively, and a heat sink 1018.

Good heat dissipation requires low thermal resistance at the interfaces between the circuit board 1010, the backplane 1012, and the heat sink 1018. The interface between the circuit board 1010 and the backplane 1012 may be filled with a thermal interface material layer 1020. The thermal interface material layer 1020 reduces the thermal resistance by minimizing or eliminating the air gaps between the circuit board 1010 and the backplane 1012. Minimum thermal resistance is achieved by ensuring that the interface material layer 1020 is a uniform thin layer. This may be done by applying pressure on the circuit board 1010 against the backplane 1012.

Moreover, the reflector bodies 1014, 1016 themselves can be pathways for thermal dissipation. The reflector bodies 1014, 1016 are preferably composed of a stiff, thermally conductive material such as aluminum, for example. The reflector bodies 1014, 1016 can thereby act as clamps to apply pressure to the circuit board 1010 against the backplane 1012, with clamping force supplied by bolting the two elements together or otherwise affixing them. The reflector bodies 1014, 1016 can also act as fins to dissipate heat away from the circuit board 1010. Thermal dissipation through the reflector bodies 1014, 1016, is most effective if thermal resistance from the circuit board 1010 to the reflector bodies 1014, 1016 is minimized by adding thermal interface material layers 1022, 1024. Layer 1022 is disposed between the circuit board 1010 and the reflector bodies 1014, 1016. Layer 1024 is disposed between the reflector bodies 1014, 1016 and the backplane 1012. The layers 1022, 1024 are compliant, so that the reflector bodies 1014, 1016 can still exert clamping force.

Figure 11:
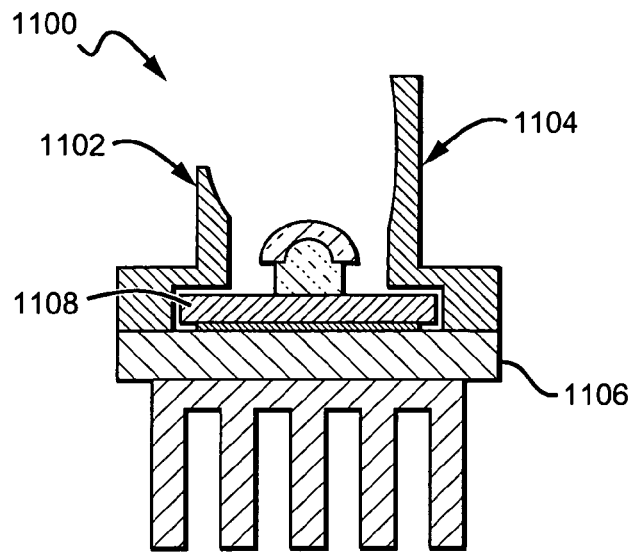
FIG. 11 is a cross-sectional view of an embodiment of a radiation distribution system.

FIG. 11 shows another embodiment of a radiation distribution system 1100. The reflector bodies 1102, 1104 are integrally formed onto the backplane 1106. For example, the backplane 1106 and reflector bodies 1102, 1104 can be extruded as a single component. In this embodiment, thermal resistance from the backplane 1106 to the reflector bodies 1102, 1104 is minimized, and some alternate means can be used to clamp the circuit board 1108 to the backplane 1106.

Figure 12A:
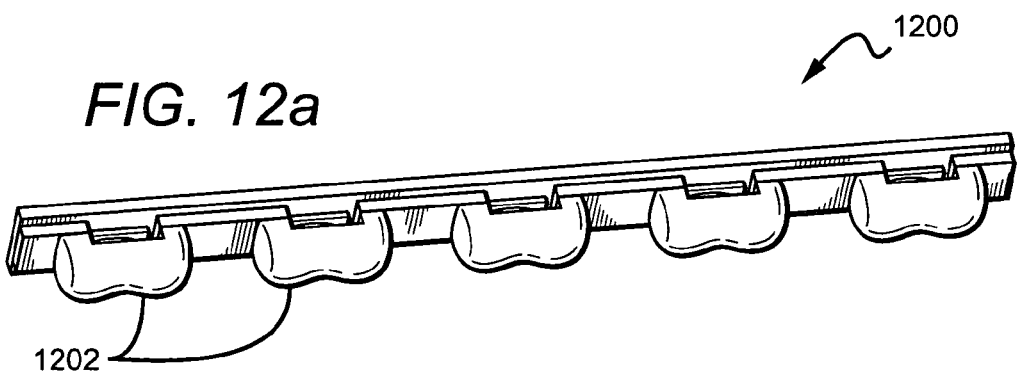
FIGS. 12a and 12b are perspective views an embodiment of a linear array of lenses and sources.
Figure 12B:
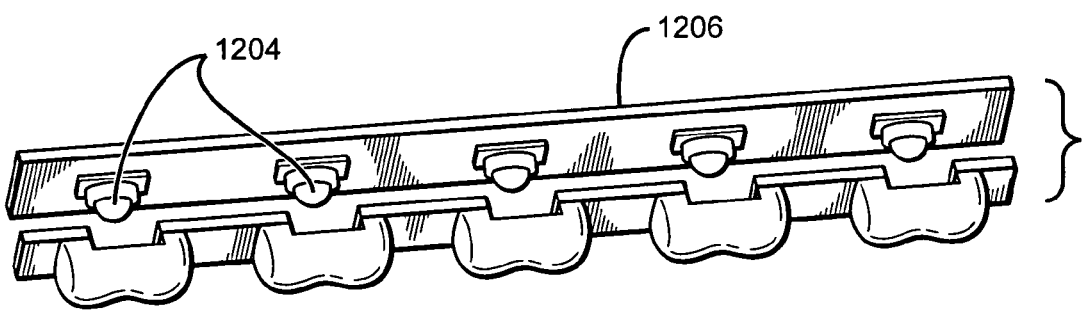

FIGS. 12*a* and 12*b* show an embodiment of a lens/source array 1200, with FIG. 12*b* providing an exploded view of the array 1200. Multiple lenses 1202 are disposed over corresponding radiative sources 1204. In this embodiment the radiative sources 1204 comprise LEDs, although other radiative sources may also be used. The lenses 1202 may be fabricated separately and mounted to a mount surface, or they may be fabricated as a single piece as shown in FIG. 12*b*. The lenses are spaced such that they cooperate with the LEDs which are mounted to a circuit board 1206.

FIGS. 13*a* and 13*b* show an embodiment of a radiation distribution system 1300, with FIG. 13*b* providing an exploded view of the system 1300. A lens/source array 1302 such as the array shown in FIG. 12*a* is disposed on circuit board 1304. Reflector bodies 1306 are disposed on the circuit board 1304 such that the array 1302 is arranged between any two reflector bodies 1306 as shown. The reflector bodies are positioned so that two different reflective surfaces 1308, 1310 face the array 1302 and interact with a portion of the radiation emitted from the array 1302 as discussed in detail above. In the exploded view of FIG. 13*b*, the sources 1312 and the lenses 1314 which combine to form the array 1302 are shown separately. Although the array 1302 is shown comprising five lens/source pairs, it is understood that additional or fewer lens/source pairs can be used as the design dictates.

Figure 14A:
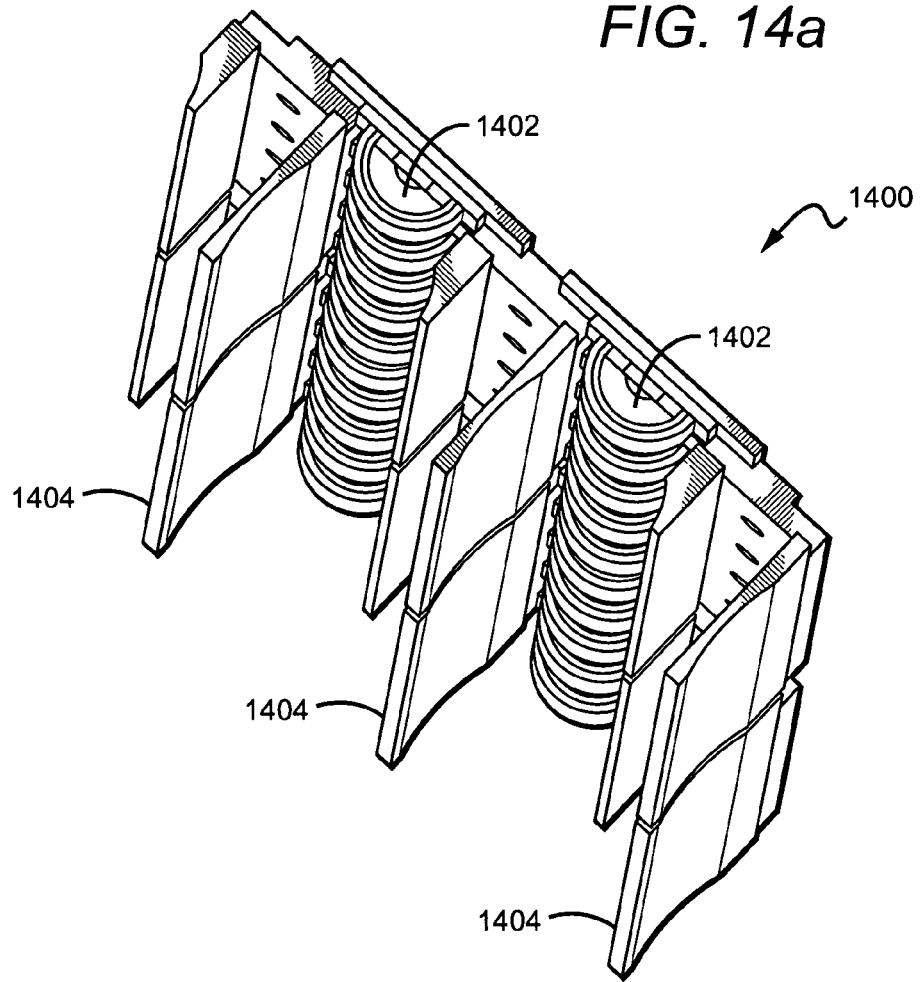
FIG. 14a is a perspective view of an embodiment of a radiation distribution system.
Figure 14B:
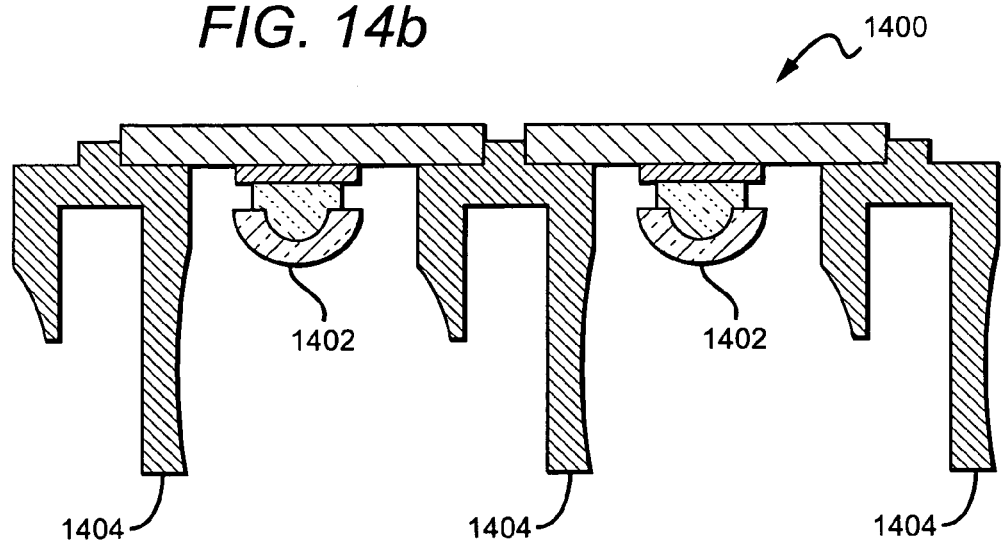
FIG. 14b is a cross-sectional view of same.

FIGS. 14*a* and 14*b* illustrate an embodiment of a radiation distribution system 1400, with FIG. 14*b* providing a cross-sectional view of the system 1400. The system 1400 comprises multiple lens/source arrays 1402, each of which are disposed between any two reflector bodies 1404 as shown. When linear arrays 1402 are placed side by side in this manner, fabrication and assembly are simplified by forming multiple reflective surfaces on one reflector body. Thus, the system 1400 is easily scalable. Although two arrays 1402 are shown arranged between three reflector bodies 1404, it is understood that additional arrays and reflector bodies may be added as needed, for example, to increase the radiative output of the system 1400.

Figure 15A:
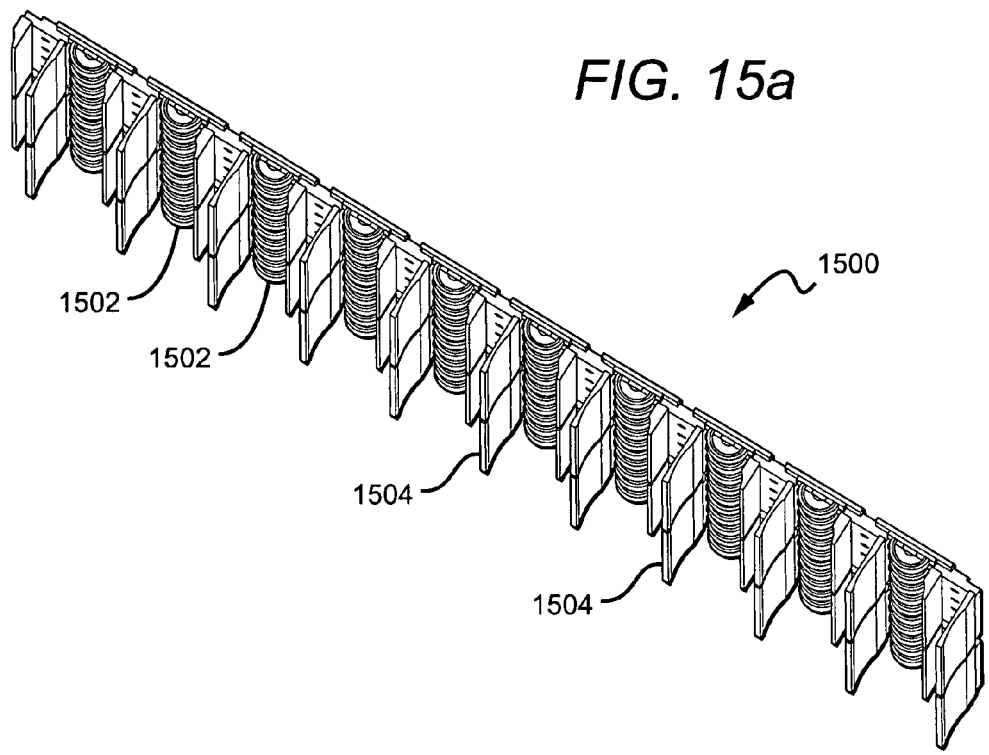
FIG. 15a is a perspective view of an embodiment of a radiation distribution system.
Figure 15B:
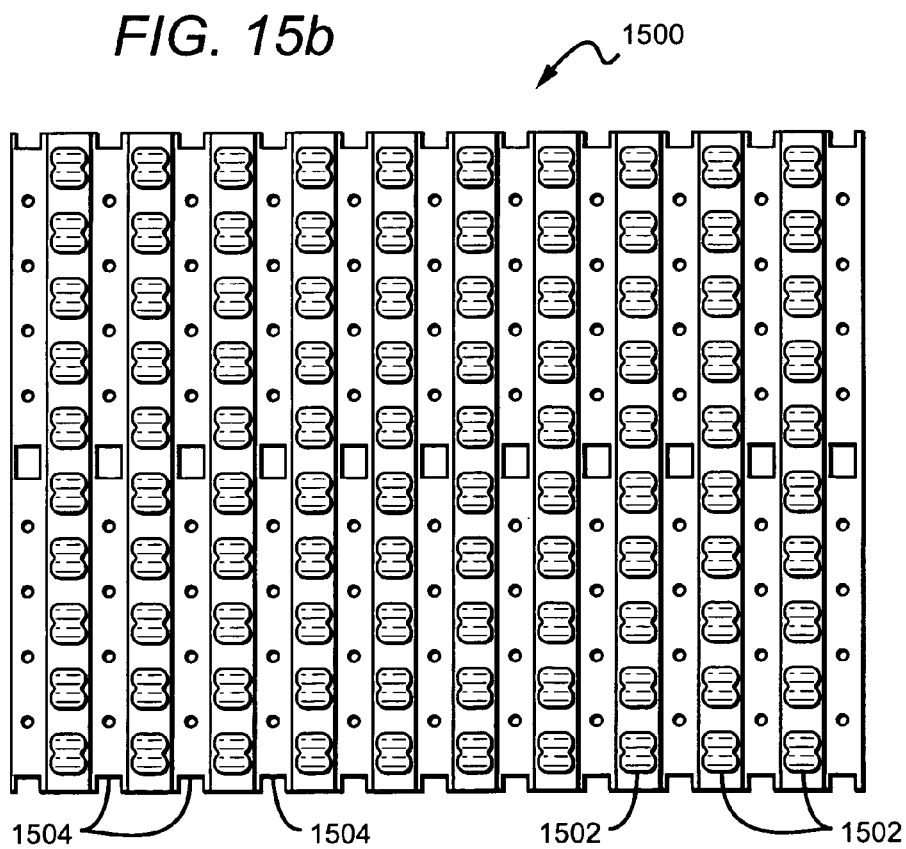
FIG. 15b is a top plan view of same.

FIGS. 15*a* and 15*b* show an embodiment of a radiation distribution system 1500. This particular embodiment comprises a 10×10 array of lens/source pairs 1502. The lens/source pairs are arranged between the reflector bodies 1504 as shown. The system 1500 is scalable; additional lens/source pairs and reflector bodies may be added as needed. The system may also be scaled down for more compact applications.

All of the embodiments shown in FIGS. 12-15 may include additional elements to improve performance and efficiency. One such element, as shown in FIG. 11, is a heat sink. Heat sinks may be attached separately to individual lens/source pairs, to arrays of lens/source pairs, or to multiple arrays as a single element. As the number of sources increases, the need for good thermal dissipation typically increases, so that low thermal resistance is particularly desirable in two-dimensional array systems.

Additionally, the systems may be mounted to fixtures and suspended above a surface for applications such as street lighting, for example. In typical applications for the array systems, the distance from the source fixture to the surface of incidence is much larger (e.g., more than 10 times larger) than the size of the array. In this case, it is well-known that the output distribution for the array systems will be substantially similar to the output distribution for a single-element system.

Although the present invention has been described in detail with reference to certain configurations thereof, other versions are possible. Therefore, the spirit and scope of the invention should not be limited to the versions described above.

We claim:

1. A radiation distribution system, comprising:
a lens along an x-axis and on a mount surface, said lens comprising a width along a y-axis, wherein said y-axis is perpendicular to said x-axis, and a height along a z-axis perpendicular to both the x-axis and the y-axis, said lens comprising a dielectric surface and comprising:
a width along a y-axis, wherein said width of said lens is tapered inward toward the middle of said lens;
a middle section comprising a concave center region that is tapered in along both the y-axis and the z-axis, said lens configured such that at least some emitted light initially impinging on said middle section of said lens is emitted through a surface of said middle section of said lens; and
two rounded end sections, each of said rounded end sections extending farther away from said mount surface in a direction parallel to the z-axis than said middle section, one of said end sections on each side of said middle section; and
at least two elongated reflective surfaces external to said lens and proximate to said lens, said elongated reflective surfaces comprising a length along said x-axis, a width along a y-axis, and a height along a z-axis, and wherein said length is larger than each of said width and said height; and
wherein light emitted from a radiative source interacts with said two rounded end sections of said lens and said elongated reflective surfaces to yield a batwing distribution pattern.

2. The radiation distribution system of claim 1, wherein said radiative source is on said mount surface such that a portion of radiation emitted from said radiative source interacts with said lens, wherein the primary emission of said radiative source is along said z-axis or an axis parallel to said z-axis.

3. The radiation distribution system of claim 2, wherein said radiative source comprises a light emitting diode (LED).

4. The radiation distribution system of claim 2, wherein said radiative source comprises a plurality of LEDs.

5. The radiation distribution system of claim 2, wherein a portion of said radiation that interacts with said lens is redirected by said elongated reflective surfaces.

6. The radiation distribution system of claim 2, further comprising a heat sink in thermal contact with said radiative source such that said heat sink does not obstruct radiation emitted from said radiative source.

7. The radiation distribution system of claim 2, further comprising an encapsulant on said light source, said lens fitting over said encapsulant.

8. The radiation distribution system of claim 7, wherein said encapsulant is dome-shaped and fits inside a dome-shaped cavity of said lens.

9. The radiation distribution system of claim 1, said dielectric surface comprising symmetry with respect to a longitudinal axis and a transverse plane.

10. The radiation distribution system of claim 9, wherein said lens is longer along the longitudinal direction than in the transverse plane.

11. The radiation distribution system of claim 1, said at least two reflective surfaces comprising first and second elongated reflective surfaces, said first and second reflective surfaces proximate to said lens on opposite sides such that said first reflective surface faces said second reflective surface.

12. The radiation distribution system of claim 11, wherein said first and second elongated reflective surfaces are concave.

13. The radiation distribution system of claim 1, wherein said elongated reflective surfaces comprise a high thermal conductivity material.

14. The radiation distribution system of claim 1, wherein said elongated reflective surfaces comprise aluminum.

15. The radiation distribution system of claim 1, said dielectric surface comprising symmetry with respect to a longitudinal axis, wherein said lens is longer along the longitudinal direction than along a direction orthogonal to the longitudinal direction.

16. The radiation distribution system of claim 1, said dielectric surface comprising a saddle-point at said middle section.

* * * * *